(12) United States Patent
Phan Le et al.

(10) Patent No.: US 9,383,285 B2
(45) Date of Patent: Jul. 5, 2016

(54) MEMS RESONATOR PRESSURE SENSOR

(71) Applicant: ams International AG, Rapperswil-Jona (CH)

(72) Inventors: Kim Phan Le, Eindhoven (NL); Willem Frederik Adrianus Besling, Eindhoven (NL)

(73) Assignee: AMS INTERNATIONAL AG, Rapperswil-Jona (CH)

( * ) Notice: Subject to any disclaimer, the term of this patent is extended or adjusted under 35 U.S.C. 154(b) by 323 days.

(21) Appl. No.: 14/034,346

(22) Filed: Sep. 23, 2013

(65) Prior Publication Data

US 2014/0208857 A1    Jul. 31, 2014

(30) Foreign Application Priority Data

Sep. 25, 2012  (EP) .................................... 12185960

(51) Int. Cl.
*G01L 11/00* (2006.01)
*G01L 11/04* (2006.01)
*G01L 9/00* (2006.01)
*B81C 1/00* (2006.01)
*G01L 19/00* (2006.01)

(52) U.S. Cl.
CPC .............. *G01L 11/04* (2013.01); *B81C 1/00158* (2013.01); *G01L 9/0019* (2013.01); *G01L 19/0092* (2013.01)

(58) Field of Classification Search
CPC ........... G01L 9/00; G01L 7/00; G01L 9/0042; H01L 27/14689
USPC .......................... 73/702, 700; 438/53, 50, 48
See application file for complete search history.

(56) References Cited

U.S. PATENT DOCUMENTS

| 5,352,918 A * | 10/1994 | Thomas ................ G01L 9/0073 257/417 |
| 2008/0184804 A1* | 8/2008 | Leverrier .............. G01L 9/0008 73/702 |
| 2012/0262241 A1* | 10/2012 | Phan Le ............. H03H 9/02259 331/154 |

OTHER PUBLICATIONS

Eaton, W. P. et al. "Micromachined Pressure Sensors: Review and Recent Developments", Smart Structures and Materials, pp. 530-539 (1997).
Tang, Zhangyang et al. "A Silicon Micromachined Resonant Pressure Sensor", 8th China International Nanoscience and Technology Symposium, Journal of Physics: Conference Series 188, 4 pgs (2009).
Extended European Search Report for Patent Appln. No. 12185960.7 (Feb. 21, 2013).

* cited by examiner

*Primary Examiner* — Lisa Caputo
*Assistant Examiner* — Nigel Plumb
(74) *Attorney, Agent, or Firm* — McDermott Will & Emery LLP

(57) ABSTRACT

A resonant MEMS pressure sensor in which the resonator mass of the MEMS resonator is anchored both to the fixed base beneath the resonator cavity as well as to the top membrane over the resonator cavity. This provides a more robust fixing of the resonator mass and offers a dependence of resonant frequency on the pressure outside the cavity.

13 Claims, 6 Drawing Sheets

MEMS RESONATOR PRESSURE SENSOR

CROSS-REFERENCE TO RELATED APPLICATIONS

This application claims the priority under 35 U.S.C. §119 of European patent application no. 12185960.7, filed on Sep. 25, 2012, the contents of which are incorporated by reference herein.

This invention relates to MEMS pressure sensors.

Pressure sensors are used often in consumer electronics for instance in weather stations, in HVAC (Heating, Ventilation, and Air Conditioning) systems for buildings, altimeters in watches or hand-held equipment for skydivers and mountain climbers, in automotive applications such as for tyre pressure measurements, and various medical applications.

Since the last decade, MEMS technology has been utilized for pressure sensors with the aim to miniaturize the device's form-factor, and to reduce power consumption and cost. In addition, MEMS technology allows in principle monolithic integration with CMOS circuits that are used for control, signal readout and communication. As a result of MEMS technology, pressure sensors are now present in many tyre pressure monitoring systems (TPMS) integrated into the tyre valve or rim, or in watches and mobile devices for altitude measurements.

The most common principle of MEMS pressure sensor uses a piezoresistive strain gauge attached on a thin membrane that covers a hermetic cavity. A fixed pressure is kept inside the cavity. When the pressure outside changes, the membrane deflects which causes the resistance of the strain gauge to change due to the piezoresistive effect. The resistance change is the indication of the pressure change.

Another popular technique is to use the capacitance change between a membrane and a fixed surface of the cavity as a measurement of pressure. This technique requires lower power. However, this technique may be prone to electrical field interference from outside if the sensor is not shielded properly. The required sub femto-Farad readout with atto-Farad accuracy of the capacitance changes requires very sophisticated readout circuits which must have excellent stability against temperature changes.

A relatively newer technique is to use a resonant device, for instance a MEMS resonator to measure pressure. A typical example of such device is mentioned e.g. in the article "A silicon micromachined resonant pressure sensor" by Zhangyang Tang et al, Journal of Physics: Conference Series 188 (2009) 012042. In this device, a resonator is attached via at least two anchors to the inner side of a membrane that seals a vacuum cavity. When the membrane deflects due to pressure changes, the stress of the membrane makes the stiffness of the resonator change, which results in its resonant frequency changing.

The resonant frequency of a resonator is generally described as $\omega=\sqrt{(k/m)}$, in which k is the stiffness and m is the mass of the resonator. Resonant pressure sensors have been shown to exhibit better pressure sensitivity and lower temperature sensitivity than piezoresistive sensors.

An example of the construction of a prior-art resonant pressure sensor is shown in FIG. 1.

There is a cavity 10 formed on a common substrate 12. A membrane (diaphragm) 14 covers one side of the cavity. A fixed (low) pressure is kept inside the cavity. A resonator 16 is attached via at least two anchors 18 to the inner side of the membrane. When the pressure changes, the change in the deflection of the membrane induces stress change in the resonator via the anchors, which finally leads to resonant frequency change.

To have larger sensitivity, the area of the membrane should be large, so that the device can convert the same pressure to a larger force, and the thickness of the membrane should be small enough to concentrate the stress change mainly to the resonator. In addition, the pressure inside the cavity should be kept low, preferably in vacuum to reduce air damping on the resonator. Low air damping is crucial for MEMS resonators to ensure high quality factor.

With the MEMS technology, to realize such a large and thin membrane which has no support in the middle and can withstand at least 1 bar of atmosphere is generally very difficult. Due to the initial stress the membrane may collapse or may develop cracks after fabrication. For example, a Si-membrane is likely to collapse at 1 bar when it is larger than about 100 µm and has a thickness less than 1.5 µm.

According to the invention, there is provided an apparatus and method as defined in the independent claims.

In one aspect, the invention provides a pressure sensor comprising:

a MEMS resonator formed within a cavity, wherein the cavity comprises a fixed base and a top membrane which deforms in response to the pressure to be sensed, wherein the resonator has a resonant frequency which is dependent on the incident pressure, wherein the MEMS resonator comprises a resonator mass which is anchored both to the fixed base and the top membrane.

The MEMS resonant sensor thus has at least two anchors, in which at least one of the anchors is attached to the membrane of the MEMS cavity and at least one of the other anchors is attached to a fixed base of the cavity (such as the substrate). When the membrane deflects due to pressure change, the strain induced between the fixed and the moveable anchors makes a change in the stiffness of the resonator, thus changes its resonant frequency. In this way, a large and relatively thin membrane can be supported on both sides and therefore is more robust while high sensitivity can still be achieved.

In one implementation, the MEMS resonator comprises a beam with at least one anchor at each end, wherein at least one anchor is attached to the top membrane and at least one anchor is attached to the fixed base.

This means the beam is strained in the torsional mode when a pressure change is applied to the membrane. This design gives large frequency change when the membrane deflects.

In one version, the MEMS resonator comprises two anchors at each end of the beam, a first which connects to the fixed base and a second which connects to the top membrane, wherein the first anchor at one end is on an opposite lateral side of the beam to the first anchor at the other end, and the second anchor at one end is on an opposite lateral side of the beam to the second anchor at the other end.

This defines a diagonal arrangement of anchors, with fixed anchors at the ends of one diagonal and movable anchors at the ends of the opposite diagonal. The resonant oscillation induces bending in the plane of the beam, and the pressure causes torsional strain as indicated above.

In another version, the MEMS resonator comprises one anchor at each end of the beam, one of which connects to the fixed base and the other of which connects to the top membrane. This provides a more compact resonator design.

In another implementation, the MEMS resonator comprises a frame with a set of parallel beams extending across the frame and each beam anchored at its middle.

There can be four parallel beams, with two at one lateral side of the frame and two at the other lateral side of the frame, wherein at each lateral side, one beam is anchored to the fixed base and the other is anchored to the top membrane. More generally, there can be any even number of parallel beams, half of which connect to the membrane and half of which connect to the base.

The MEMS resonator can comprise a resonator mass formed from a portion of the top silicon layer of a buried oxide substrate arrangement, and the fixed base can be the bottom silicon substrate.

The pressure sensor preferably has an actuation electrode for actuating the MEMS resonator and a sense electrode for sensing the MEMS resonator oscillations, and a feedback control circuit for sustaining resonator oscillations.

The invention also provides a pressure sensor arrangement, comprising:
a pressure sensor of the invention; and
a reference (or calibration) sensor, wherein the reference (or calibration) sensor comprises:
a MEMS resonator formed within a cavity, wherein the cavity comprises a fixed base and a top membrane which deforms in response to the pressure to be sensed,
wherein the MEMS resonator comprises a resonator mass which is anchored only to the fixed base.

In this arrangement, the reference sensor is not sensitive to the deformation of the top membrane since it is not connected to it. It is used for example to compensate for temperature variations, by monitoring changes in sensor signal which are not caused by the sensed pressure.

The invention also provides a method of fabricating a pressure sensor, comprising:
forming a MEMS resonator within a cavity, wherein the cavity comprises a fixed base and a top membrane which deforms in response to the pressure to be sensed, wherein the resonator has a resonant frequency which is dependent on the incident pressure; and
anchoring a resonator mass both to the fixed base and the top membrane.

The resonator mass is preferably formed from a portion of the top silicon layer of a buried oxide substrate arrangement. The anchor to the fixed base can then be formed by a selective etching of the oxide layer of the buried oxide substrate arrangement. This merely requires control of the etching of the buried oxide layer, which is a process step already required to form the portion of the resonator cavity beneath the resonator mass.

The anchor to the top membrane can be formed by a selective etching of a sacrificial layer before the sacrificial etching, and the un-etched portions of the sacrificial layer form the cavity portion over the resonator mass. Again, the sacrificial layer is already etched to define the shape of the top part of the cavity, so the sacrificial layer patterning is simply selected to define the top anchors (as will already be done for known examples with the resonator connected only to the top membrane or only to the base).

Thus, the invention can be implemented with minor modification to the existing processing.

Examples of the invention will now be described in detail with reference to the accompanying drawings, in which.

The invention provides a resonant MEMS pressure sensor in which the resonator mass of the MEMS resonator is anchored both to the fixed base beneath the resonator cavity as well as to the top membrane over the resonator cavity. This provides a more robust fixing of the resonator mass.

Figure 1:
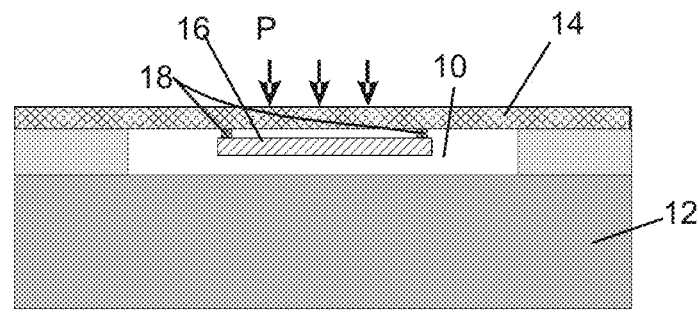
FIG. 1 shows a known MEMS resonant pressure sensor.
Figure 2:
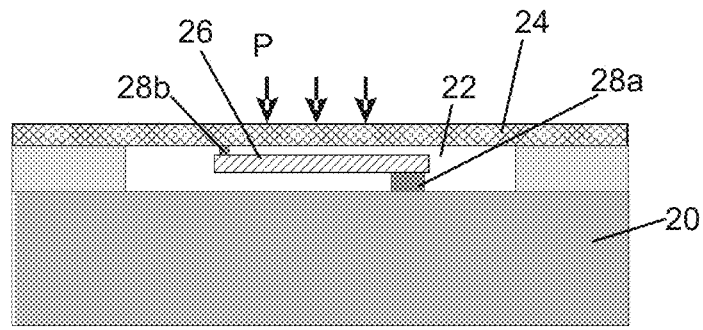
FIG. 2 shows a cross-section of an example of pressure sensor of the invention.

FIG. 2 shows a cross-section of an example of MEMS resonant pressure sensor of the invention.

The pressure sensor has a substrate 20, which can for example be made of a semiconductor material such as Si, SiGe, etc, or a different type of material such as Si oxide, Al oxide, etc.

A cavity 22 is formed over the substrate 20. The cavity can be made inside the substrate (using so-called MEMS bulk micromachining), or made on top of the substrate (using so-called MEMS surface micromachining).

A membrane 24 (also called cap) covers one side of the cavity, and makes the cavity hermetic. The pressure inside the cavity is preferably lower than atmospheric pressure for low air damping of the resonator. The membrane 24 can be made from a semiconductor material, such as Si, poly Si, SiGe, or a compound such as Si nitride, Si oxide, or a metal, alloy, etc.

A MEMS resonator 26 is built inside the cavity. The MEMS device can be made of the same material as the substrate (e.g. Si), or a different material (e.g. SiGe).

The resonator has at least two anchors 28a, 28b, in which at least one anchor 28a is attached to the fixed substrate 20, and which can be considered to be a fixed anchor, and at least one anchor 28b is attached to the membrane 24 and which can be considered to be a moveable anchor.

The resonator can be of any type, such as a flexural mode resonator or extensional mode resonator. The transduction method of the resonator can be capacitive, piezoresistive, piezoelectric, or based on a thermally excited principle, etc.

The construction of the resonator should be such that when strain is induced between the moveable and fixed anchors, the resonator's stiffness is changed, thus its resonant frequency is changed. This strain is induced by the external pressure (shown as P) applied to the pressure sensor, so that the resonator has a resonant frequency which is dependent on the incident pressure.

In a more particular embodiment, the resonator is a clamped-clamped beam resonator with four anchors. Two anchors are provided at opposite lateral sides of each end of the beam 30.

Figure 3:
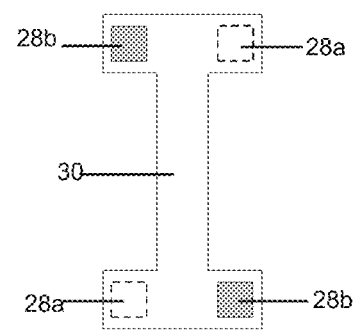
FIG. 3 shows a top view of a first example of resonator which can be used in the pressure sensor of the invention.

FIG. 3 shows the top view of an example of resonator. The resonator has an in-plane mode shape, where the beam alternatively bends to the left and to the right (of the drawing in FIG. 3). Each end of the beam 30 is attached (clamped) to two anchors, in which one anchor is attached to the substrate and the other is attached to the membrane. Thus, each beam end has a fixed anchor 28a and a movable anchor 28b.

The positions of the moveable and fixed anchors of both ends of the resonator are arranged in the point-symmetry configuration, in which the middle of the resonator beam is the centre of symmetry. For instance, in FIG. 3, the upper end of the beam has two anchors: the left anchor is moveable and the right anchor is fixed. The lower end of the beam has two anchors, in which the left anchor is fixed while the right anchor is moveable.

In this way, when the membrane deflects in the direction perpendicular to the plane of the drawing in FIG. 3, the two moveable anchors are moved also in the direction perpendicular to the plane of the drawing, while the two fixed anchors are fixed to the substrate. In this way, the resonator beam is twisted along its axis when the membrane deflects. This gives rise to a stiffness change. The stiffness change finally results in a frequency change, which can be readout as a measurement of pressure change.

Figure 4:
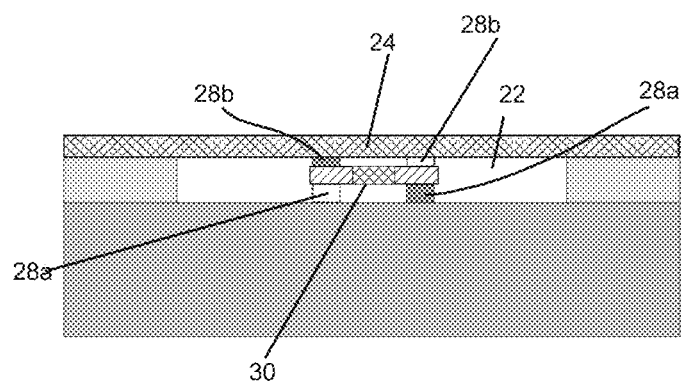
FIG. 4 shows a cross-sectional view across the resonator beam of FIG. 3.

FIG. 4 shows the cross-sectional view across the resonator beam (the longitudinal direction of the beam 30 is perpendicular to the plane of the drawing in FIG. 4).

Figure 5:
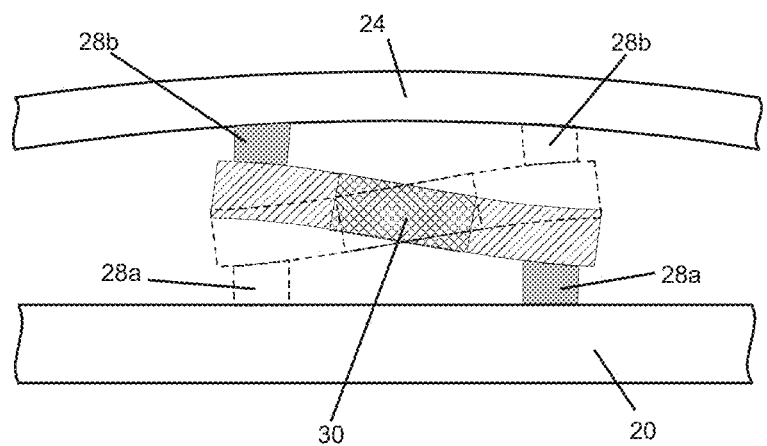
FIG. 5 shows an enlarged view of the FIG. 4 when the membrane deflects.

FIG. 5 shows an enlarged view of the resonator in the cross-section view, looking along the resonator beam, when the membrane deflects.

In FIG. 5, one end of the beam and the associated two anchors are shown in solid lines and the other end and the associated two anchors are shown in dotted lines.

The actuation and sensing electrodes of the resonator are preferably attached to the substrate, spaced from the edges of the resonator beam by small gaps (not shown in the figures).

To demonstrate the principle, finite element simulations have been performed based on a model of the resonator structure. The model consists of a membrane made of Si, measuring 100 µm×100 µm (lateral dimensions)×1.5 µm (thickness). In order to evacuate air inside the cavity, the membrane contains many vent holes. After evacuating, the holes are plugged by aluminium blocks. These are also taken into account in the modeling. The blocks need to be small enough and separated to reduce the stiffness of the membrane. Under the membrane there is a clamped-clamped beam resonator as described above.

Various pressures around 1 bar are set on top of the membrane to simulate the ambient air pressure.

In the modeled design, the resonant frequency is 23.813 MHz. The resonant mode shape of the resonator is in-plane. That means, during vibration, the beam bends sideways, within in the plane of the membrane.

Figure 6:
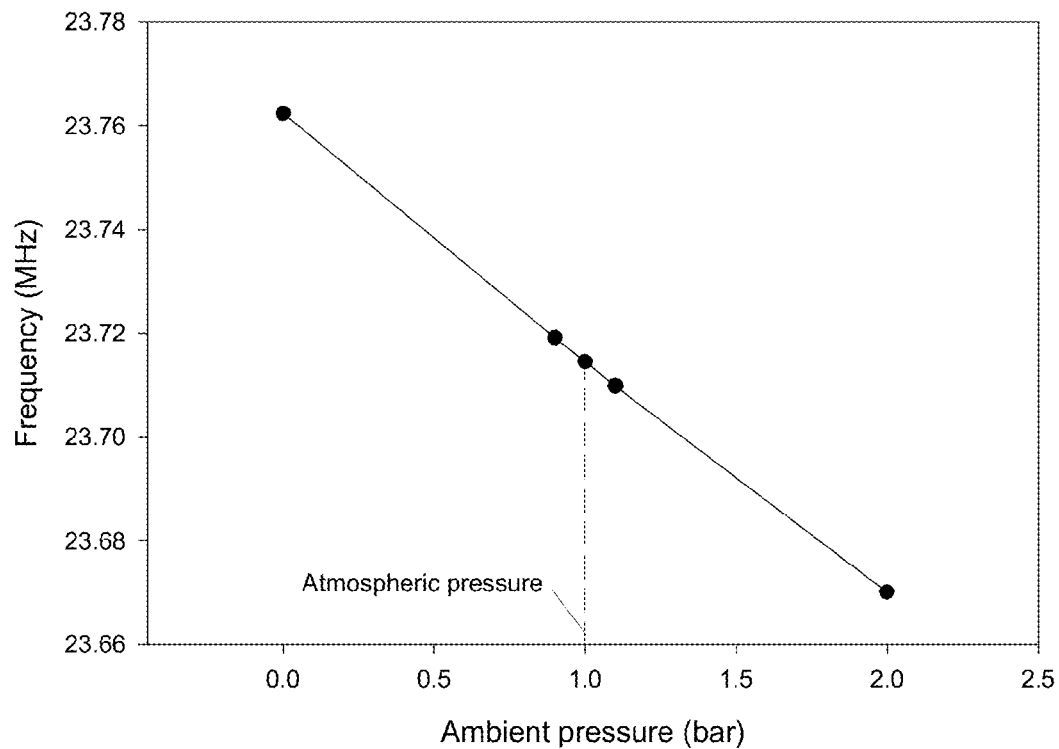
FIG. 6 shows a simulated sensitivity curve of the sensor of FIGS. 3 to 5.

The simulation was performed with different ambient pressures, and the sensitivity curve is shown in FIG. 6. The sensitivity is 46 Hz/mbar, which is about the same as in the case when all anchors of the same resonator are attached to the membrane as in the known prior-art. The advantage of the construction of the invention is that the membrane can be significantly more robust since it is supported through the resonator structure at the middle.

The robustness of the supported membrane enables its area to be several times larger. When the membrane area increases, the force that is exerted on the resonator proportionally increases, and the sensitivity thus increases.

There are many types of resonator that can be used within a device in accordance with the invention.

Figure 7:
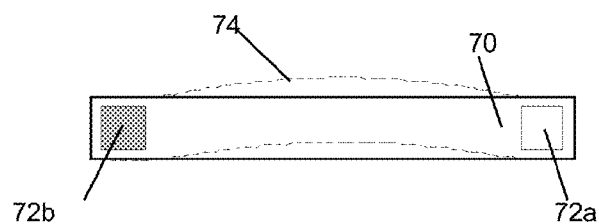
FIG. 7 shows a top view of a second example of resonator which can be used in the pressure sensor of the invention.

A second example is shown in FIG. 7, having a simple clamped-clamped beam resonator 70 that has two anchors 72a,72b, one 72b attached to the membrane and the other one 72a attached to the substrate. When the membrane deflects due to pressure change, it induces strain to the resonator and thus makes its resonant frequency change. The mode shape is shown in dotted lines 74.

Figure 8:
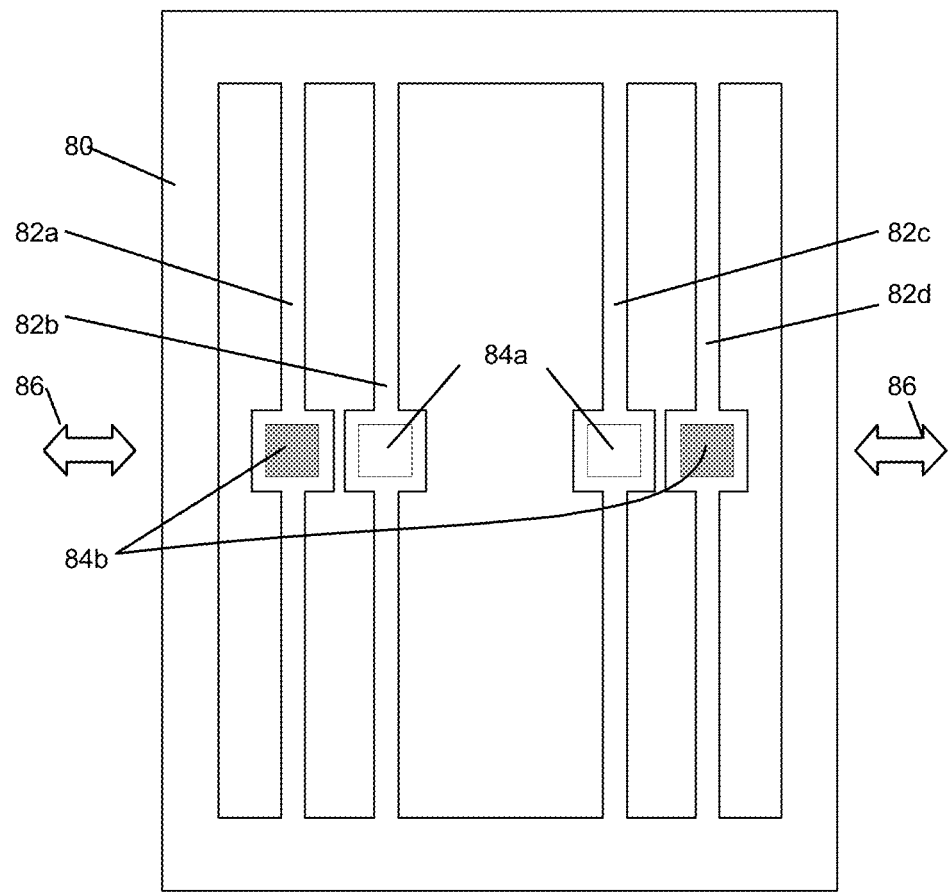
FIG. 8 shows a top view of a third example of resonator which can be used in the pressure sensor of the invention.

A third example is a shuttle resonator as shown in FIG. 8.

The mass of the resonator is in the form of a frame 80. The frame has four parallel beams 82a-82d, in which two beams 82b, 82c are anchored at their middle to the substrate (fixed anchors 84a) and the other two beams 82a,82d are attached to the membrane (moveable anchors 84b). Thus, there are two beams at one lateral side of the frame and two at the other lateral side of the frame, wherein at each lateral side, one beam (82b for the left side and 82c for the right side) is anchored (84a) to the fixed base and the other (82a for the left side and 82d for the right side) is anchored (84b) to the top membrane (24).

The resonator vibrates in the direction of the arrows 86, so that the mode shape is in-plane. When the membrane deflects due to pressure change, it induces strain to the resonator beams thus makes its resonant frequency change.

Figure 9:
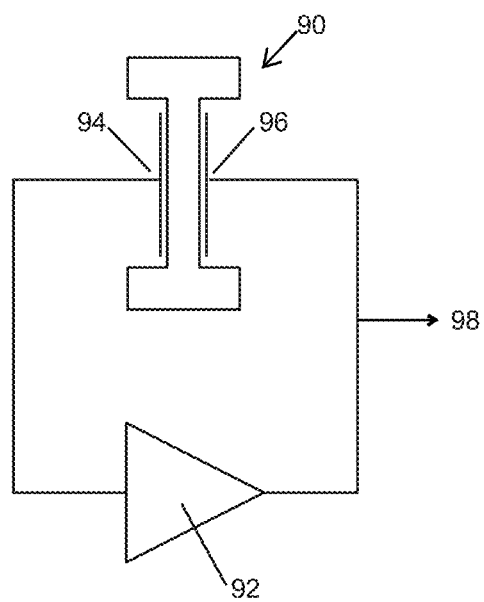
FIG. 9 shows a schematic circuit diagram of the circuit incorporating the pressure sensor.

In a real implementation of the sensor, the resonator is formed within an oscillation loop to maintain the resonant frequency. A schematic circuit diagram is shown in FIG. 9.

The oscillator loop contains the resonator 90 and a feedback amplifier 92. The gain and the phase of the amplifier are chosen such that the total gain of the loop is equal or larger than 1 and the total phase shift of the loop is zero or close to zero. The amplifier amplifies the output signal from the sensing electrode 94 of the sensor (i.e. the resonator), and feeds the amplified signal back to the actuation electrode 96 of the resonator. With an appropriate loop again and loop phase, the resonance can be maintained within the loop, and this resonance signal can be readout at any point on the loop, such as the output of the amplifier as shown as output 98. The output signal is then processed to obtain the resonant frequency, using e.g. a frequency counter. The frequency is then converted to pressure using a formula that contains calibration data.

As for many other types of pressure sensor, the sensor signal (that is the resonant frequency) of the resonant pressure sensor to some extent is also temperature dependent. This is mainly due to the fact that Young's modulus of the material of the resonator is temperature dependent, which makes its stiffness, and thus its frequency temperature dependent.

This effect can be corrected for using any of many known methods that have been used in the field of MEMS resonators, such as:

(i) Coat the resonator with a layer of a different material that has an opposite temperature coefficient of Young's modulus (TCY). With an appropriate thickness of the coating layer, the total temperature coefficient of frequency (TCF) of the whole resonator can be reduced to virtually zero. For example, if the resonator is made of Si, which has TCY of −60 ppm/K (part per million change per Kelvin), the coating material can be Si dioxide which has TCY of +196 ppm/K.

(ii) Use a temperature sensor to measure temperature of the resonator and correct for the temperature dependence in the readout circuit.

(iii) Heat the resonator beam with a DC current in such a way that, with a feedback loop and a temperature sensor, temperature of the beam is kept constant.

In addition, a new correction method can be applied.

On the same substrate, in the vicinity of the pressure sensor, another cavity can be formed that contains a second resonator. The shape and dimensions of the second resonator are identical to those of the first resonator (which is the sensor), but with all anchors attached to the substrate. This functions as a reference sensor again having a MEMS resonator formed within a cavity between the substrate and a top membrane which deforms in response to the pressure to be sensed.

Because all the anchors are fixed, the resonant frequency of the reference (second) resonator is not pressure sensitive, but has exactly the same temperature dependence as the first resonator. By comparing the frequencies of the two resonators, information on the pressure change only can be obtained.

There are many processes can be used to fabricate the resonant sensor.

Figure 10:
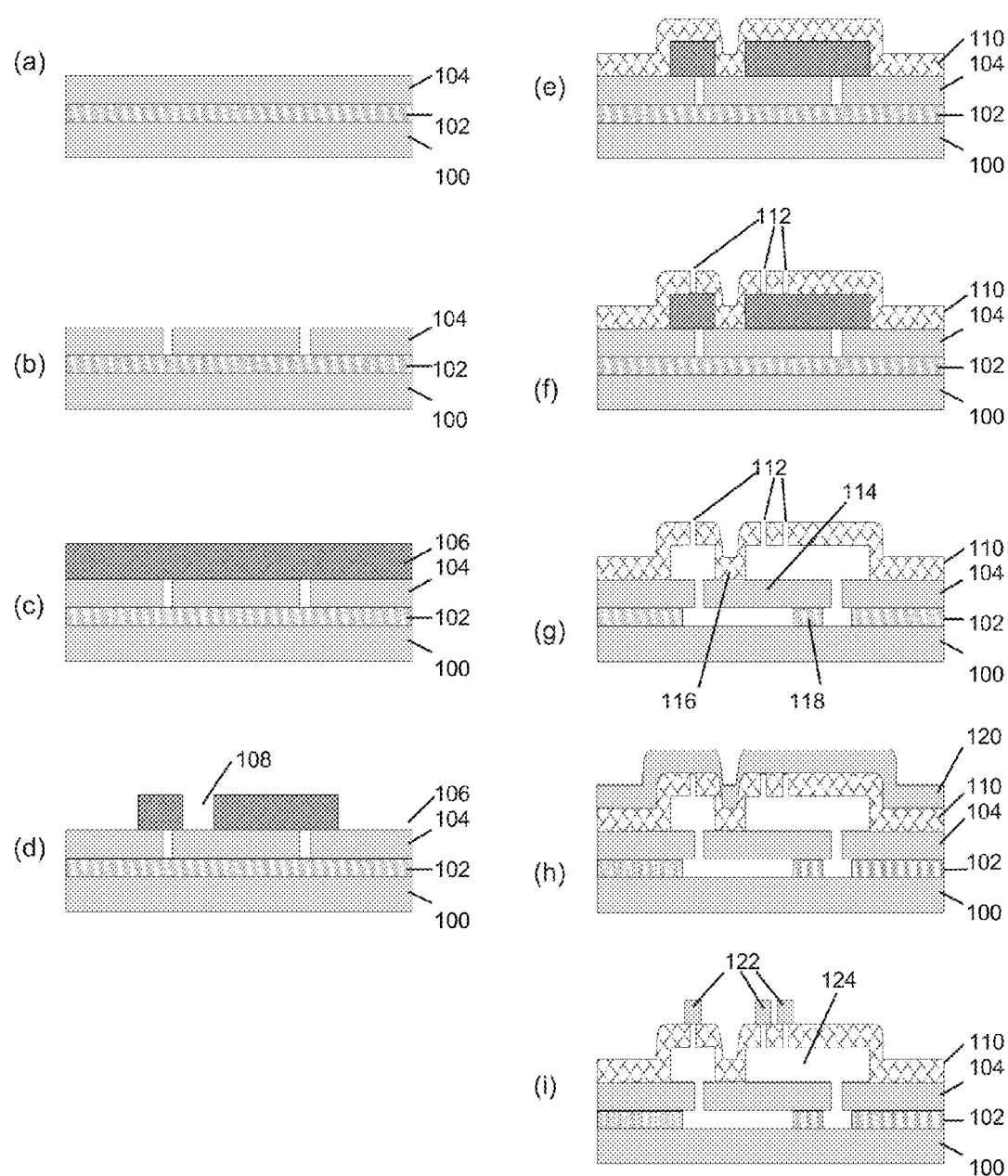
FIG. 10 shows an example of process flow for forming the resonator part of the pressure sensor of the invention.

One example is explained with reference to FIG. 10.

FIGS. 10(a) to 10(i) show the main sequential processing steps.

The process starts with a blank Silicon On Insulator (SOI) wafer as shown in FIG. 10(a). The SOI wafer is a silicon wafer that consists of three layers: a thick Si substrate 100 on the bottom, a buried silicon oxide layer (BOX) 102, and on the top, a single crystal silicon layer (SOI layer) 104. The BOX and the SOI layers normally have thickness of a few up to tens of micrometers.

The top SOI layer 104 is patterned into the shape of the resonant sensor using a hard mask, lithography and an etching technique as shown in FIG. 10(b).

A sacrificial layer 106 with a thickness of a few micrometers is deposited on the patterned SOI layer as shown in FIG. 10(c). Any suitable deposition technique can be used, such as sputtering, evaporation, CVD, PECVD, etc. The material of the sacrificial layer can be silicon dioxide, or another material, such as silicon nitride, a metal such as aluminium, etc.

The sacrificial layer is patterned using lithography and an etching technique to create the shape of the cavity as shown in FIG. 10(d). At the same time, one or more holes 108 inside the cavity area are also created. These correspond to the location of the moveable anchors to be formed. In this way, the anchor to the top membrane is formed by a selective etching of the sacrificial layer before the sacrificial etching. The un-etched portions of the sacrificial layer form the cavity portion over the resonator mass, and an etched portion or portions are used to form the movable anchor or anchors.

A cap layer 110 is deposited as shown in FIG. 10(e), using one of the deposition techniques described above. The material of the cap should preferably be a non-conducting material, and a different material than that of the sacrificial layer. For example, if the sacrificial layer is Si dioxide, the cap layer can be pure poly-silicon (therefore has very low electrical conduction), SiGe, Si nitride, or a polymer, etc. The non-conduction of the cap layer is to avoid electrical short between electrical connectors of the device. In addition, the cap material should be such that when the sacrificial layer is etched chemically (in a later step), the cap layer is not etched or etched with substantially lower etching rate.

Small vent holes 112 are patterned in the cap layer, on the location of the cavity, using lithography and an etching technique. The size of the holes is preferably small, such as a few micrometers or smaller than a micrometer. The locations of the holes are inside the area of the cap, but preferably not directly on top of the movable MEMS beam(s). In the same step and lithography mask, contact holes can be created outside the cavity area (not shown).

The sacrificial layer, and subsequently a part of the BOX layer are etched chemically (e.g. wet etch, plasma etch, vapour etch, etc) through the vent holes as shown in FIG. 10(g). Because the etching rate of the cap is very much smaller than that of the sacrificial layer and the BOX layer, the cap remains intact throughout the etch. If the materials of the sacrificial layer and the BOX layer are different, the etching step is split into two different steps. If they are the same, such as both are Si dioxide, they can be etched in one step, using the same chemical.

Near to the end of the etching step, when the BOX layer is etched, the etch should be stopped in time. The timing should be such that the whole moveable MEMS structure 114 can totally be released, while the fixed anchors, the main part of the electrodes and the fixed surroundings of the device are not etched, thus still attached firmly to the substrate. After this step, the MEMS resonant sensor is free standing, with at least one (movable) anchor 116 attached to the cap layer, and at least one (fixed) anchor 118 attached to the substrate. In this way, the fixed anchor is formed by a selective etching of the oxide layer 102.

In a vacuum or low pressure environment, a plug layer 120 is deposited on top of the whole wafer as shown in FIG. 10(h). Just prior to the deposition, because of the vacuum or low pressure outside, the cavity is evacuated or partly evacuated. The deposition of the plug layer seals the cavity, leaving a vacuum or low pressure inside the cavity. The material of the plug should be chosen such that it has good adhesion with the cap, and is able to seal off the vent holes hermetically. The material is preferably a metal, such as aluminium, because with the same step, electrical bond-pads outside the cavity can be formed.

The plugs and the bond pads are patterned using lithography and an etching technique. The plugs 122 are thus separated to reduce the stiffness of the membrane as shown in FIG. 10(i). If the plug material is not conducting, there will be another step to create the electrical bond-pads; otherwise, this step ends the process. The cavity is shown as 124 with portions above and below the resonator mass.

The electrical connections for the actuation/sensing electrodes can be created in the Si layer 104 of the BOX substrate. The connections for the resonating beam can be made via the doped Si substrate and an Al electrode on top of the membrane that connects the Si resonating beam in the membrane.

Using SiGe membrane/resonator technology the pressure sensor device can also be constructed on CMOS having the advantage of an integrated read-out circuit underneath the sensor, improving signal to noise ratio, reducing size and packaging costs.

The structure of the invention has at least one anchor attached to the cap (the membrane) of the vacuum cavity, and at least one anchor attached to the fixed substrate so that the membrane is better supported. Thus, the membrane can be made much larger without collapsing and therefore the sensitivity can be improved.

The wafer fabrication process described above is a wafer level/thin film process, as opposed to some other wafer-bonding process. The advantage of a wafer-level process is that the die size can be smaller, thus lower cost. The process is also simpler using standard CMOS processes.

The examples above make use of an in-plane bending mode. However, the invention can also be applied to a design with an out-of-plane bending mode.

The pressure sensors of the invention can be used in the application fields described above, namely consumer electronics for instance in weather stations, in HVAC (Heating, Ventilation, and Air Conditioning) systems for buildings, altimeters in watches or hand-held equipment for skydivers and mountain climbers, in automotive applications such as for tyre pressure measurements, and various medical applications.

Various modifications will be apparent to those skilled in the art.

The invention claimed is:
1. A pressure sensor comprising:
a MEMS resonator formed within a cavity,
wherein the cavity comprises a fixed base and a top membrane which deforms in response to the pressure to be sensed, wherein the resonator has a resonant frequency which is dependent on the incident pressure, wherein the MEMS resonator comprises a resonator mass that comprises a beam with a first and a second anchor at each end of the beam, and wherein the first anchors connect to the fixed base and the second anchors connect to the top membrane.

2. A pressure sensor as claimed in claim 1, wherein the first anchor at one end is on an opposite lateral side of the beam to the first anchor at the other end, and the second anchor at one end is on an opposite lateral side of the beam to the second anchor at the other end.

3. A pressure sensor as claimed in claim 1, wherein the MEMS resonator comprises a resonator mass formed from a portion of the top silicon layer of a buried oxide substrate arrangement.

4. A pressure sensor as claimed in claim 3, wherein the fixed base comprises the bottom silicon substrate of the buried oxide substrate arrangement.

5. A pressure sensor as claimed in claim 1 comprising an actuation electrode for actuating the MEMS resonator and a sense electrode for sensing the MEMS resonator oscillations, and a feedback control circuit for sustaining resonator oscillations.

6. A pressure sensor arrangement, comprising:
a pressure sensor as claimed in claim 1; and
a reference sensor,
wherein the reference sensor comprises a MEMS resonator formed within a cavity,
wherein the cavity comprises a fixed base and a top membrane which deforms in response to the pressure to be sensed, and
wherein the MEMS resonator comprises a resonator mass which is anchored only to the fixed base.

7. A method of fabricating a pressure sensor, comprising:
forming a MEMS resonator within a cavity,
wherein the cavity comprises a fixed base and a top membrane which deforms in response to the pressure to be sensed, and
wherein the resonator has a resonant frequency which is dependent on the incident pressure; and anchoring the MEMS resonator having a resonator mass that comprises a beam with a first and a second anchor at each end of the beam by anchoring the first anchors to the fixed base and the second anchors to the top membrane.

8. A method as claimed in claim 7, comprising forming the resonator mass formed from a portion of the top silicon layer of a buried oxide substrate arrangement.

9. A method as claimed in claim 8, comprising forming an anchor to the fixed base by a selective etching of the oxide layer of the buried oxide substrate arrangement.

10. A method as claimed in claim 8, comprising forming an anchor to the top membrane by a selective etching of a sacrificial layer before the sacrificial etching, which un-etched portions of the sacrificial layer form the cavity portion over the resonator mass.

11. A pressure sensor comprising:
a MEMS resonator formed within a cavity,
wherein the cavity comprises a fixed base and a top membrane which deforms in response to the pressure to be sensed,
wherein the resonator has a resonant frequency which is dependent on the incident pressure,
wherein the MEMS resonator comprises a resonator mass which is anchored both to the fixed base and the top membrane, and
wherein the resonator mass comprises a frame with a set of parallel beams extending across the frame and each beam anchored at its middle.

12. A pressure sensor as claimed in claim 11, wherein there are four parallel beams, with two at one lateral side of the frame and two at the other lateral side of the frame, and
wherein at each lateral side, one beam is anchored to the fixed base and the other is anchored to the top membrane.

13. A pressure sensor as claimed in claim 11, wherein there is an even number of parallel beams, with half anchored to the fixed base and the other half anchored to the top membrane.

* * * * *